United States Patent
Yoon (12) 
(10) Patent No.: US 6,670,239 B2
(45) Date of Patent: Dec. 30, 2003

(54) NON-VOLATILE MEMORY CELL HAVING BILAYERED FLOATING GATE AND FABRICATING METHOD THEREOF

(75) Inventor: Ki-chang Yoon, Suwon (KR)

(73) Assignee: Samsung Electronics Co., Ltd. (KR)

( * ) Notice: Subject to any disclaimer, the term of this patent is extended or adjusted under 35 U.S.C. 154(b) by 59 days.

(21) Appl. No.: 09/791,910

(22) Filed: Feb. 22, 2001

(65) Prior Publication Data

US 2001/0017808 A1 Aug. 30, 2001

(30) Foreign Application Priority Data

Feb. 24, 2000 (KR) .......................................... 2000-9107

(51) Int. Cl.[7] ..................... H01L 21/336; H01L 21/3205
(52) U.S. Cl. .......................... 438/257; 438/211; 438/593
(58) Field of Search ................................. 438/259, 257, 438/264, 283, 593, 592, 596, 201, 211; 257/314, 315, 316, 317, 321

(56) References Cited

U.S. PATENT DOCUMENTS

| 4,267,632 | A | | 5/1981 | Shappir ........................ 29/571 |
| 4,597,060 | A | | 6/1986 | Mitchell et al. ............. 365/185 |
| 5,111,270 | A | | 5/1992 | Tzeng ....................... 357/23.5 |
| 5,516,625 | A | * | 5/1996 | McNamara et al. ........ 430/314 |
| 5,684,739 | A | * | 11/1997 | Takeuchi ............... 365/185.03 |
| 5,940,704 | A | * | 8/1999 | Takeuchi .................... 438/257 |
| 5,962,889 | A | * | 10/1999 | Yamauchi et al. .......... 257/317 |
| 6,342,715 | B1 | * | 1/2002 | Shimizu et al. ............. 257/314 |

FOREIGN PATENT DOCUMENTS

JP 9102554 4/1997 ....... H01L/21/8247

* cited by examiner

Primary Examiner—Matthew Smith
Assistant Examiner—Lex H. Malsawma
(74) Attorney, Agent, or Firm—Mills & Onello LLP (57) ABSTRACT

A non-volatile memory cell is provided. The non-volatile memory cell includes a first conductivity type semiconductor substrate, second conductivity type source/drain regions longitudinally arranged in a direction to be parallel to each other and separated from each other by a predetermined distance in the semiconductor substrate, such that the second conductive source/drain regions define a channel region therebetween. A tunnel oxide layer is formed on the semiconductor substrate. First conductive layer patterns are formed on the tunnel oxide layer on the channel formation region in the form of islands. Buried oxide layers fill spaces between the adjacent first conductive layer patterns. Second conductive layer patterns are formed on the upper surfaces and the upper side surfaces of the first conductive layer patterns and arranged so that their edges are extended to some surfaces of the buried oxide layers. An interlayer dielectric layer is formed on the second conductive layer patterns, and third conductive layer patterns are arranged to be vertical to the source/drain regions on the interlayer dielectric layer patterns.

6 Claims, 11 Drawing Sheets

NON-VOLATILE MEMORY CELL HAVING BILAYERED FLOATING GATE AND FABRICATING METHOD THEREOF

BACKGROUND OF THE INVENTION

1. Field of the Invention

The present invention relates to a non-volatile memory cell and a method for manufacturing the same, and more particularly, to a non-volatile memory cell having a bilayered floating gate and a method for manufacturing the same.

2. Description of the Related Art

In general, a memory cell having a structure in which a floating gate and a control gate are sequentially stacked is widely used as a unit cell of a non-volatile memory. The floating gate stores data and the control gate controls the floating gate. An interlayer dielectric layer is interposed between the floating gate and the control gate.

Figure 1:
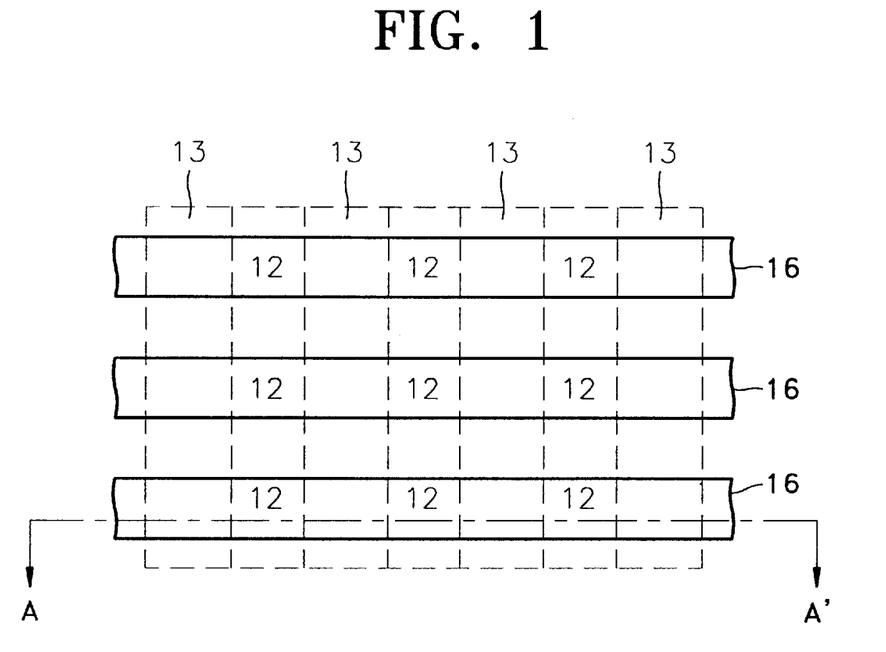
FIG. 1 is a layout diagram showing an example of a conventional non-volatile memory cell.
Figure 2:
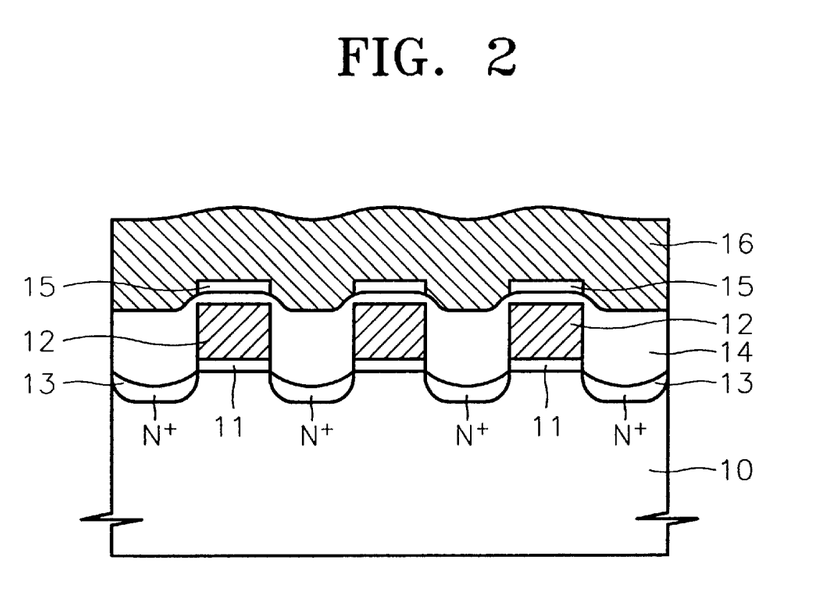
FIG. 2 is a sectional view taken along the ling A–A' of FIG. 1.

FIG. 1 is a layout diagram showing an example of a conventional non-volatile memory cell. FIG. 2 is a sectional view taken along the line A–A' of FIG. 1. Referring to FIGS. 1 and 2, buried $N^+$ source/drain regions 13 are vertically formed in stripe fashion in a semiconductor substrate 10. Second polysilicon layer patterns 16 used as control gate electrodes are horizontally formed in stripe fashion crossing the buried $N^+$ source/drain regions 13. In a region where the second polysilicon layer patterns 16 exist, tunnel oxide layers 11, first polysilicon layer patterns 12 used as floating gate electrodes, field oxide layers 14, and interlayer dielectric layers 15 are sequentially formed between the substrate 10 and the second polysilicon layer patterns 16 (refer to FIG. 2).

A smaller number of contacts can be used for the conventional non-volatile memory cell having such a structure. Also, it is possible to improve the density of a device since the field oxide layers 14 are formed on the semiconductor substrate 10. However, since the interlayer dielectric layers 15 are formed only on the upper surfaces of the first polysilicon layer patterns 12, the coupling ratio of the floating gate is low. Since the coupling ratio of the floating gate is low, it is difficult to minimize the width of the second polysilicon layer patterns 16. Accordingly, there are limitations in improving the density of such devices. Furthermore, during manufacturing processes, first polysilicon stringers can remain between the first polysilicon layer patterns 12 during an etching process for forming the second polysilicon layer patterns 16, the interlayer dielectric layers 15, and the first polysilicon layer patterns 12. Therefor, the reliability of a device can deteriorate.

SUMMARY OF THE INVENTION

To solve the above problem, it is an object of the present invention to provide a non-volatile memory cell having a bilayered floating gate, capable of maintaining a high density and increasing the coupling ratio of a floating gate.

It is another object of the present invention to provide a method for manufacturing a non-volatile memory cell having the bilayered floating gate, capable of solving various problems during an etching process.

Accordingly, in accordance with the invention, there is provided a non-volatile memory cell which includes a first conductivity type semiconductor substrate, and second conductivity type source/drain regions longitudinally arranged in a direction to be parallel to each other and separated from each other by a predetermined distance in the semiconductor substrate. The second conductivity type source/drain regions define a channel region therebetween. A tunnel oxide layer is formed on the semiconductor substrate. First conductive layer patterns are formed on the tunnel oxide layer on the channel formation region in the form of islands. Buried oxide layers filling spaces between adjacent first conductive layer patterns. Second conductive layer patterns are formed on the upper surfaces and the upper side surfaces of the first conductive layer patterns and are arranged so that their edges are extended to some surfaces of the buried oxide layers. An interlayer dielectric layer is formed on the second conductive layer patterns, and third conductive layer patterns are arranged to be vertical to the source/drain regions on the interlayer dielectric layer patterns.

The first conductive layer patterns and the second conductive layer patterns can operate as floating gates and the third conductive layer patterns can operate as control gates.

In one embodiment, the thickness of the tunnel oxide layer is about 90 to 100 Å, and the thickness of the first conductive layer pattern is preferably no less than 1000 Å.

In one embodiment, the first, second, and third conductive layer patterns are formed of polysilicon doped with impurities.

The buried oxide layer can be a flowable oxide layer.

The thickness of the buried oxide layer is preferably smaller than the thickness of the first conductive layer pattern. A difference between the thickness of the buried oxide layer and the thickness of the first conductive layer pattern is preferably about 20 Å.

The non-volatile memory cell can further comprise a first conductive isolation region located on the semiconductor substrate and formed between the adjacent first conductive layer patterns along the direction of the source/drain region.

In one embodiment, the first conductivity type is P type and the second conductivity type is N type.

In another aspect, the invention is directed to a method for forming a non-volatile memory cell. In accordance with the method, a tunnel oxide layer is formed on a first conductivity type semiconductor substrate. First polysilicon layer lines longitudinally arranged in a bit line direction and separated from each other by a predetermined direction are formed on the tunnel oxide layer. Source and drain regions are formed by implanting second conductivity type impurity ions in the semiconductor substrate restricted by the first polysilicon layer lines. First polysilicon layer patterns in the form of islands are formed by patterning the first polysilicon layer lines. Buried oxide layers for filling spaces between the first polysilicon layer patterns are formed. Second polysilicon layer lines longitudinally arranged in the bit line direction are formed to be separated from each other on the buried oxide layers and the first polysilicon layer patterns so that the second polysilicon layer lines completely cover the first polysilicon layer patterns. An interlayer dielectric layer is formed on the exposed surfaces of the second polysilicon layer lines and the buried oxide layers. Third polysilicon layer patterns longitudinally arranged in a word line direction are formed on the interlayer dielectric layer so that the third polysilicon layer patterns completely overlap the first polysilicon layer patterns and partially overlap the second polysilicon layer lines. The interlayer dielectric layer and the second polysilicon layer lines, which are exposed by the third polysilicon layer patterns, are sequentially removed.

In one embodiment, the first polysilicon layer lines are formed to have a thickness greater than 1000 Å.

The second conductivity type impurity ions can be arsenic (As) ions.

The buried oxide layers can be formed by a chemical vapor deposition (CVD) method.

Forming the buried oxide layers can include forming an oxide layer on the first polysilicon layer patterns and the exposed tunnel oxide layer and flattening the oxide layer using an etch back process so that the upper side surfaces of the first polysilicon layer patterns are exposed.

In one embodiment, the thickness of the buried oxide layer is smaller than the thickness of the first polysilicon layer patterns by 20 Å.

The interlayer dielectric layer can be formed to have an oxide/nitride/oxide (ONO) structure.

BRIEF DESCRIPTION OF THE DRAWING(S)

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS

Figure 3:
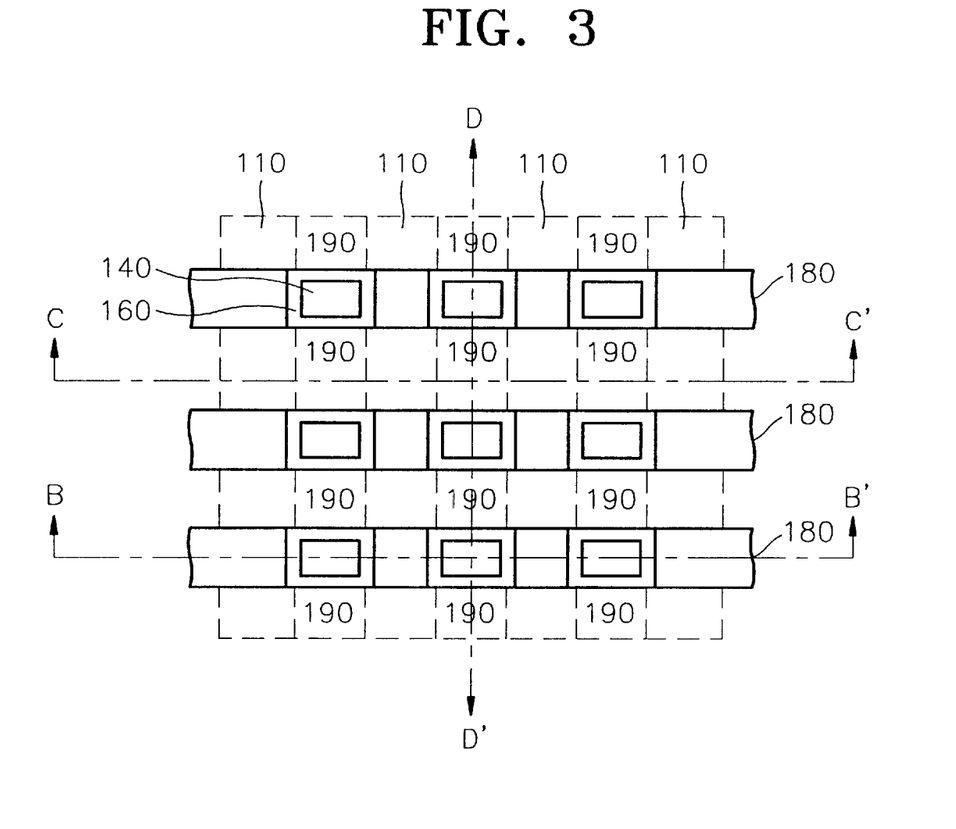
FIG. 3 is a layout diagram showing a non-volatile memory cell according to one embodiment of the present invention.
Figure 4:
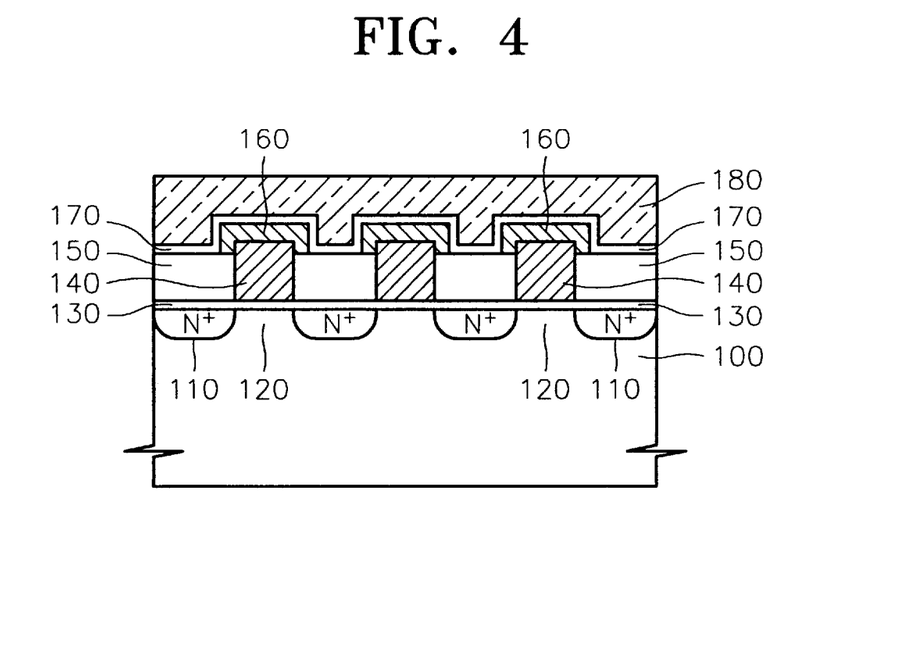
FIG. 4 is a sectional view taken along the line B–B' of FIG. 3.
Figure 5:
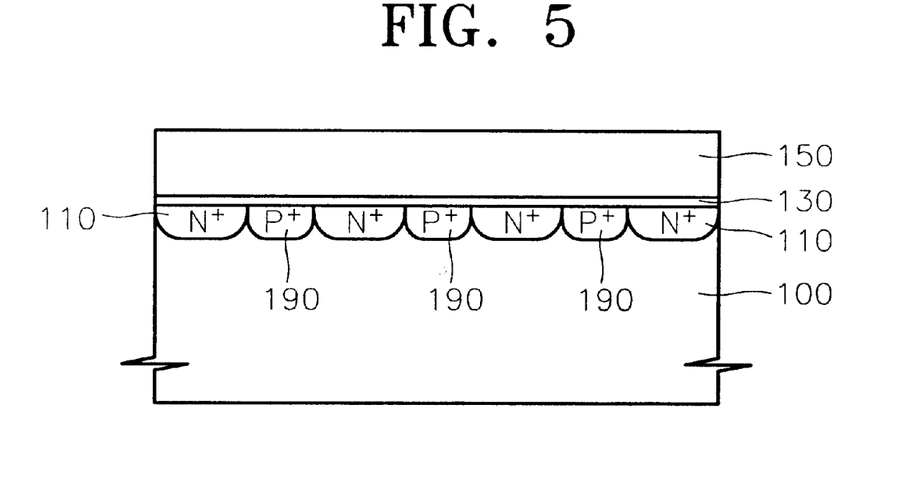
FIG. 5 is a sectional view taken along the ling C–C' of FIG. 3.
Figure 6:
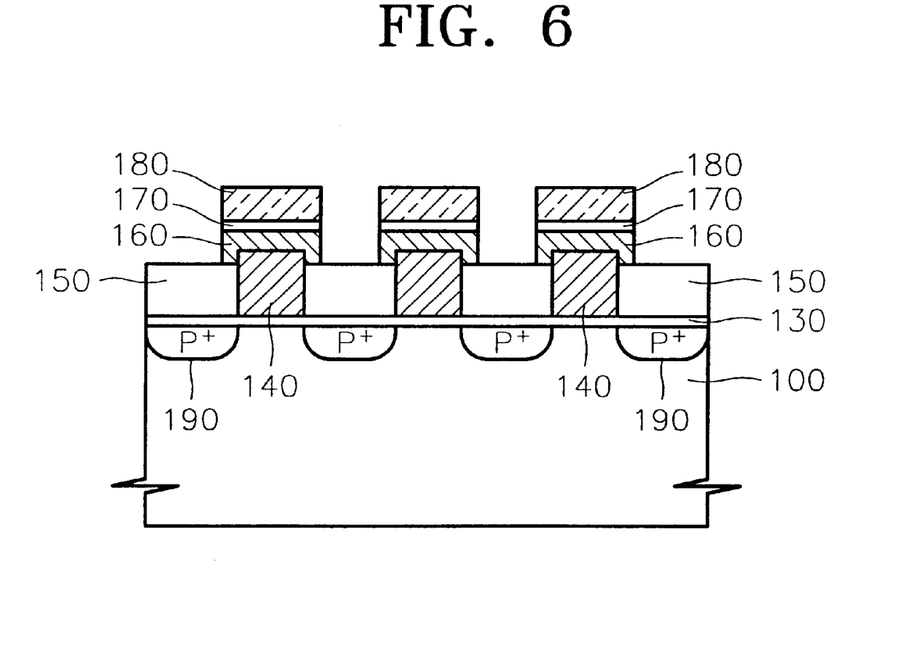
FIG. 6 is a sectional view taken along the ling D–D' of FIG. 3.

FIG. 3 is a layout diagram showing a non-volatile memory cell having a bilayered floating gate according to the present invention. FIGS. 4 through 6 are sectional views taken along the lines B–B', C–C', and D–D', respectively, of FIG. 3.

Referring to FIGS. 3 through 6, buried N+ source/drain regions 110 are longitudinally arranged in a certain direction in the upper surface of a P-type semiconductor substrate 100. A thin tunnel oxide layer 130 is formed on the semiconductor substrate 100. The thickness of the tunnel oxide layer 130 is about 90 to 100 Å. A floating gate electrode has a bilayered structure, in which first polysilicon layer patterns 140 and second polysilicon layer patterns 160 are sequentially stacked on the tunnel oxide layer 130. The first polysilicon layer patterns 140 are formed over channel regions 120 of the semiconductor substrate 100. The thickness of the first polysilicon layer pattern 140 is about 1000 to 1500 Å. A buried oxide layer 150 is formed between adjacent first polysilicon layer patterns 140. The buried oxide layer 150 is a flowable oxide layer. The thickness of the buried oxide layer 150 is smaller than the thickness of the first polysilicon layer pattern 140. Therefore, certain upper portions of the first polysilicon layer patterns 140 protrude above the upper surfaces of the buried oxide layers 150. Second polysilicon layer patterns 160 completely cover the protruding portions of the first polysilicon layer patterns 140. The edges of the second polysilicon layer patterns 160 are arranged to contact the buried oxide layers 150. An interlayer dielectric layer 170 of an oxide/nitride/oxide (ONO) structure is formed on the exposed surfaces of the second polysilicon layer patterns 160 and the buried oxide layers 150. A third polysilicon layer pattern 180 used as a control gate is longitudinally formed on the interlayer dielectric layer 170 in a direction vertical to the buried N+ source/drain regions 110. $P^+$ isolation regions 190 are formed in certain regions of the semiconductor substrate 100.

The non-volatile memory cell having such a structure is programmed by injecting hot electrons from the semiconductor substrate 100 into the floating gate electrode and is erased by tunneling the electrons from the floating gate electrode to the semiconductor substrate 100.

As shown in FIGS. 4 and 6, in the region in which the third polysilicon layer 180 exists, the tunnel oxide layer 130, the first polysilicon layers 140, the buried oxide layers 150, the second polysilicon layers 160, and the interlayer dielectric layer 170 exist on the semiconductor substrate 100. As shown in FIG. 5, in a region where the third polysilicon layer 180 does not exist, only the tunnel oxide layers 130 and the buried oxide layers 150 exist on the semiconductor substrate 100. The second polysilicon layers 160 are extended to certain portions of the surfaces on the buried oxide layers 150 so that the second polysilicon layers 160 cover some portions of the surfaces of the buried oxide layers 150 as well as the upper surfaces and the side surfaces of the first polysilicon layers 140. Therefore, the third polysilicon layer 180 and the interlayer dielectric layer 170 overlap the second polysilicon layers 160 that form some portion of the floating gate. Accordingly, the coupling ratio of the floating gate to the control gate increases. If necessary, it is possible to obtain a desired coupling ratio by controlling the thickness of the buried oxide layer 150, thus changing the surface area of the second polysilicon layer 160. Since isolation is performed by the buried oxide layers 150 without using field oxide layers for isolation, the degree of integration of a device is improved. Since the thick buried oxide layers 150 exist between the interlayer dielectric layer 170 and the semiconductor substrate 100, when the device is programmed or erased, the tunnel oxide layer 130 develops enough tolerance to an applied high voltage though a high voltage is applied to the third polysilicon layer 180.

Figure 7:
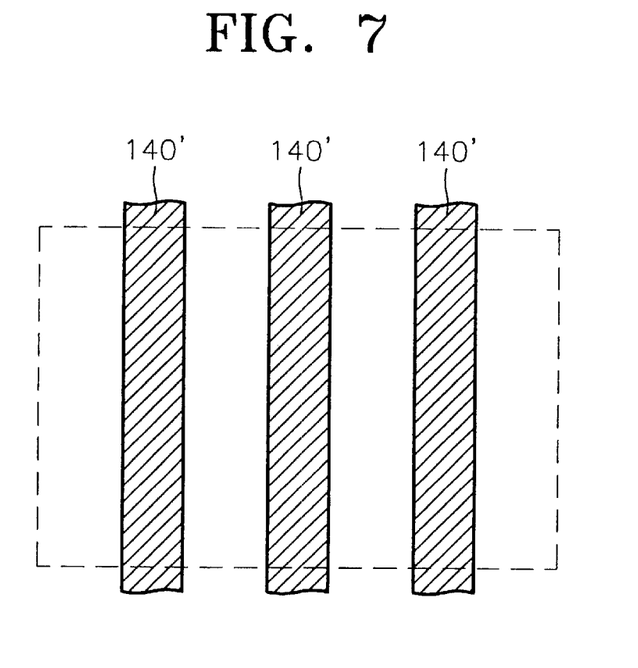
FIGS. 7 through 25 are sectional views illustrating one embodiment of a method for manufacturing the non-volatile memory cell according to the present invention.
Figure 8:
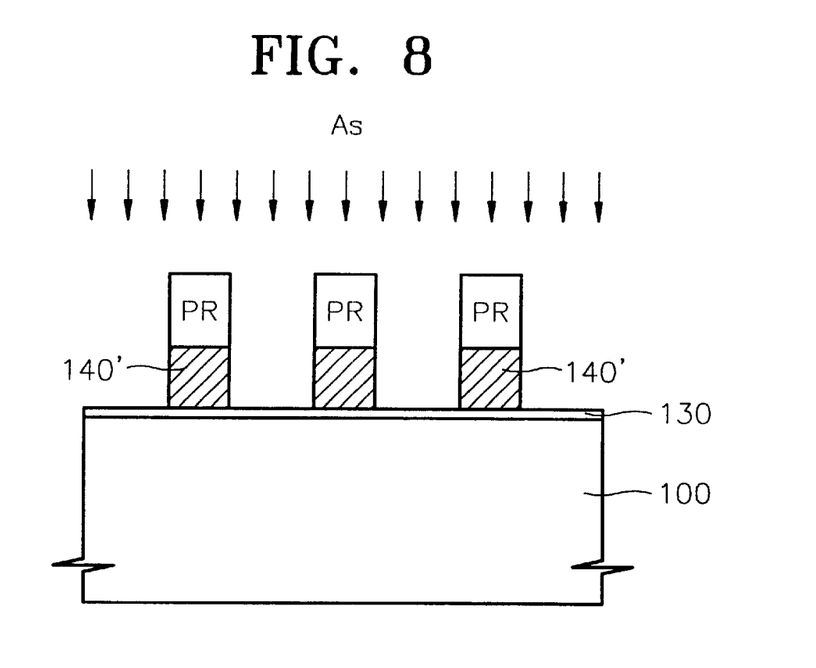

FIGS. 7 through 25 illustrate a method for manufacturing a non-volatile memory cell having a bilayered floating gate according to the present invention. As shown in FIGS. 7 and 8, first polysilicon layer lines 140' parallel to a bit line are formed over the semiconductor substrate to be separated from each other by a uniform distance. For this, a tunnel oxide layer 130 formed to be thin, for example, to have a thickness of 90 to 100 Å is formed on a $P^-$ semiconductor substrate 100. The tunnel oxide layer 130 can be formed by thermal oxidizing the surface of the $P^-$ semiconductor substrate 100. A first polysilicon layer having a thickness of 1000 to 1500 Å is formed on the tunnel oxide layer 130. The first polysilicon layer is formed of polysilicon. A photoresist layer pattern (PR) having openings separated from each other by a predetermined distance by coating a photoresist layer on the first polysilicon layer and performing exposure and development using a common lithography process. The first polysilicon layer is patterned using the photoresist layer pattern (PR) as a mask. Then, the first polysilicon layer lines 140' separated from each other by a predetermined distance are formed on the tunnel oxide layer 130.

After forming the first polysilicon layer lines 140', N-type impurity ions are implanted into the entire surface in order to form a source/drain region. Arsenic (As) is used as the N-type impurity ion. Since the photoresist layer pattern (PR) exists on the first polysilicon layer lines 140' although the N-type impurity ions are implanted into the entire surface, the impurity ions are not implanted into the first polysilicon layer lines 140'. The impurity ions are implanted into the P$^-$ semiconductor substrate 100 exposed by the photoresist layer pattern (PR). After the impurity ions are implanted, the photoresist layer pattern (PR) is removed. If necessary, the impurity ions can be implanted after forming spacers in the first polysilicon layer lines 140' in order to form a lightly doped drain (LDD) structure.

Figure 9:
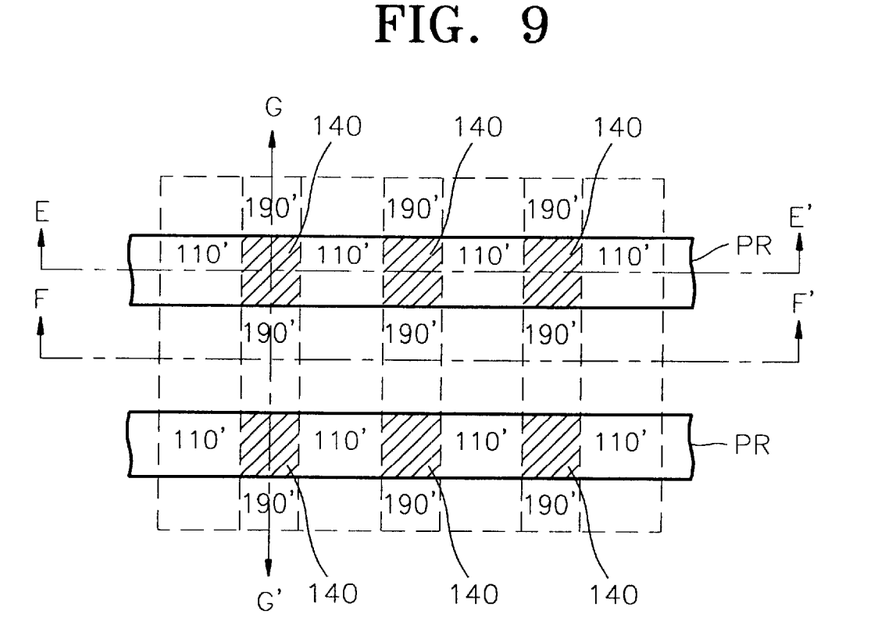
Figure 10:
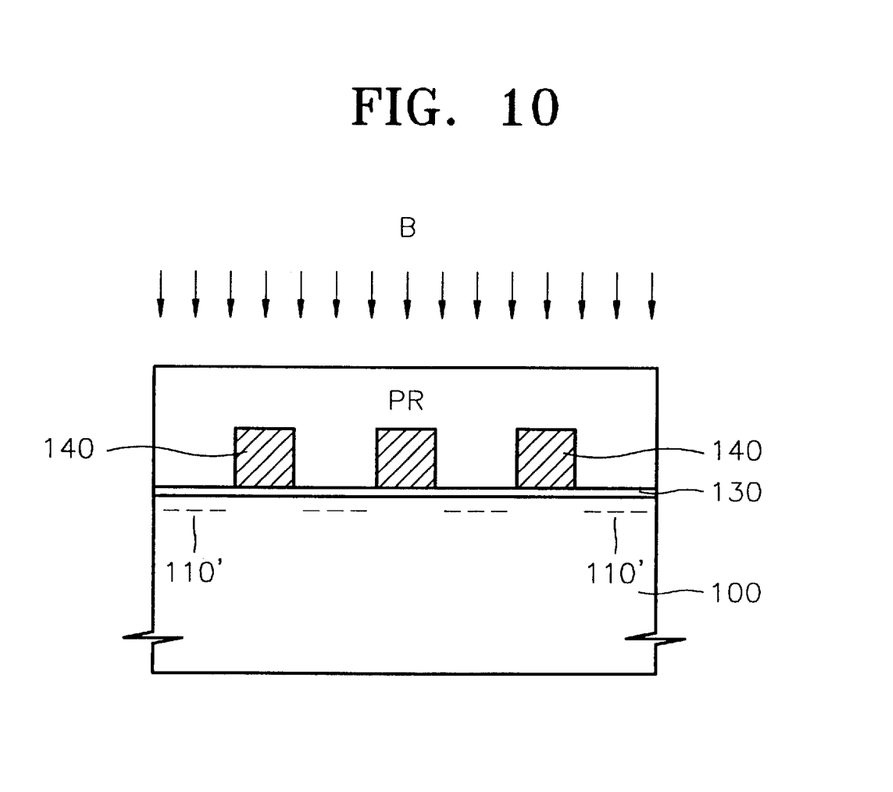
Figure 11:
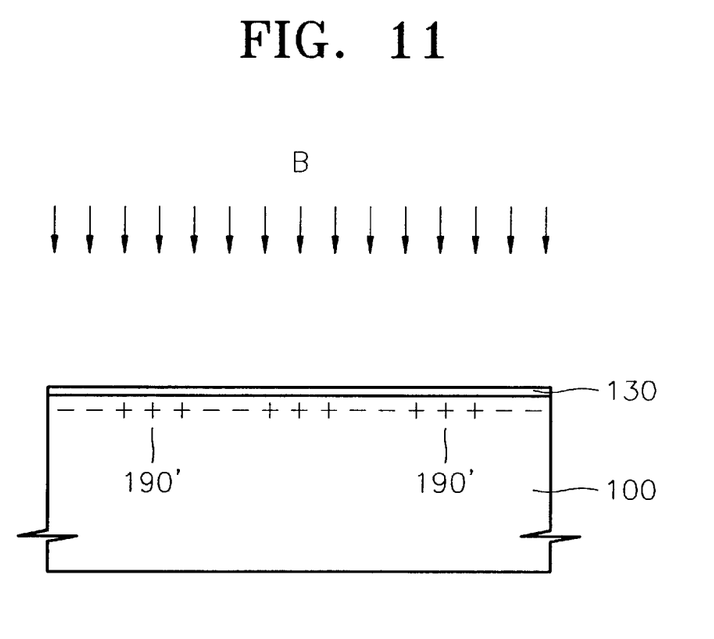
Figure 12:
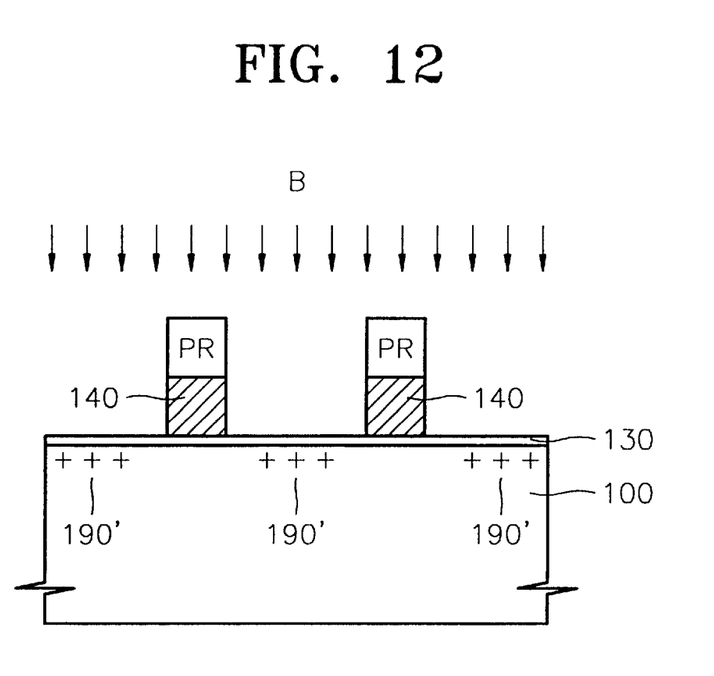

As shown in FIG. 9, the first polysilicon layer patterns 140 in the form of a square island are formed by patterning first polysilicon layer lines (140' of FIGS. 7 and 8). The entire surface is coated with the photoresist layer. As shown in FIGS. 10 through 12 taken along the lines E–E', F–F', and G–G', respectively, of FIG. 9, the photoresist layer patterns (PR) having openings separated from each other by a predetermined distance are formed by performing exposure and development using a common photolithography process. Namely, the photoresist layer pattern (PR) is longitudinally formed in a word line direction to completely cover the first polysilicon layer lines (140' of FIG. 8) in the region where the first polysilicon layer lines (140' of FIG. 8) are to be left. The photoresist layer pattern (PR) has openings that expose the first polysilicon layer lines (140' of FIG. 8) in the region where the first polysilicon layer lines (140' of FIG. 8) are to be removed. After forming the photoresist layer pattern (PR), the first polysilicon layer lines (140' of FIG. 8) are patterned using the photoresist layer pattern (PR) as a mask. Then, the first polysilicon layer patterns 140 separated from each other in bit line and word line directions is formed. After forming the first polysilicon layer patterns 140, as shown in FIGS. 10 through 12, the P-type impurity ions are implanted into the entire surface. Boron (B) is used as the P-type impurity ions. The dose of the P-type impurity ions is lower than the dose of the previously implanted N-type impurity ions. Although the P-type impurity ions are implanted into the entire surface, since the photoresist layer pattern (PR) exists on the first polysilicon layer patterns 140 and N-type impurity ion implantation regions 110' formed on both sides of the first polysilicon layer patterns 140, the impurity ions are not implanted into the part under the photoresist layer pattern (PR). The impurity ions are implanted into the P$^-$ semiconductor substrate 100 exposed by only the photoresist layer pattern (PR). The type of impurities is maintained to be N in the region, into which the N-type impurity ions and the P-type impurity ions are together implanted, due to a difference in the dose of the impurities. When the P-type impurity ions are implanted, P-type impurity ion implantation regions 190' for a P-type isolation region are formed on and under the first polysilicon layer patterns 140.

Figure 13:
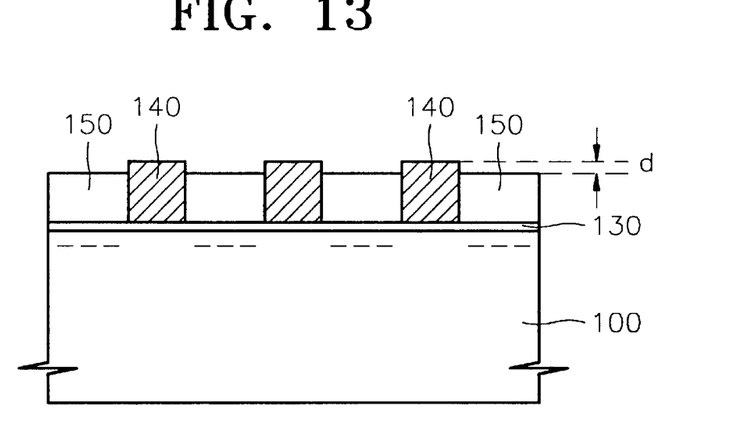
Figure 14:
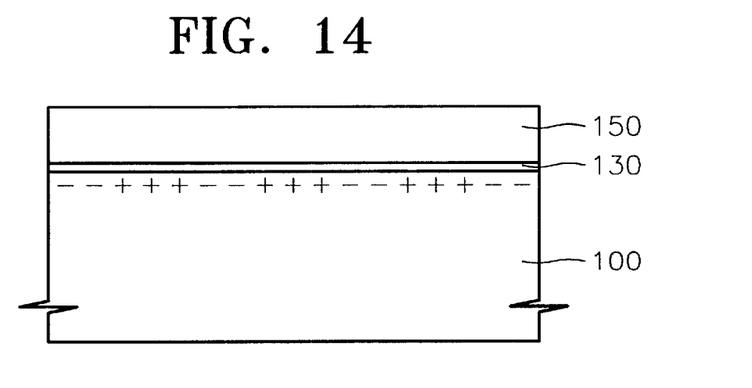
Figure 15:
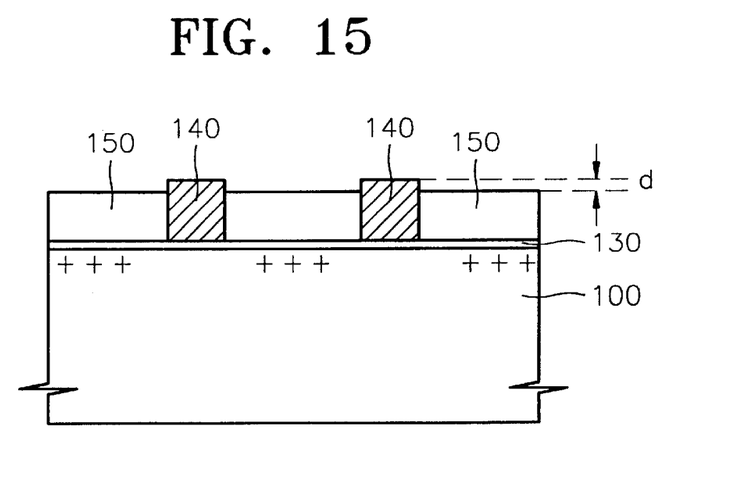

Then, the photoresist layer pattern (PR of FIGS. 9 through 11) is completely removed. An oxide layer is formed on the entire surface so as to completely cover the first polysilicon layer patterns 140. The oxide layer is a flowable oxide and the oxide layer is formed using a well-known chemical vapor deposition (CVD) method. Spaces between the first polysilicon layer patterns 140 are filled with the oxide layer and the buried oxide layers 150 that expose the upper portions of the first polysilicon layer patterns 140 are simultaneously formed by performing a polishing process on the oxide film. The polishing process can be performed using an etch back process. The buried oxide layers 150 formed after performing the polishing process are shown in FIGS. 13 through 15. FIGS. 13 through 15 are sectional views taken along the same directions and surfaces the same as those of FIGS. 10 through 12. As shown in FIGS. 13 and 15, the thickness of the buried oxide layer 150 is smaller than the first polysilicon layer pattern 140. The difference d between the thickness of the buried oxide layer 150 and the first polysilicon layer pattern 140 is about 20 Å. However, the difference can be appropriately controlled according to the desired value of the coupling ratio.

Figure 16:
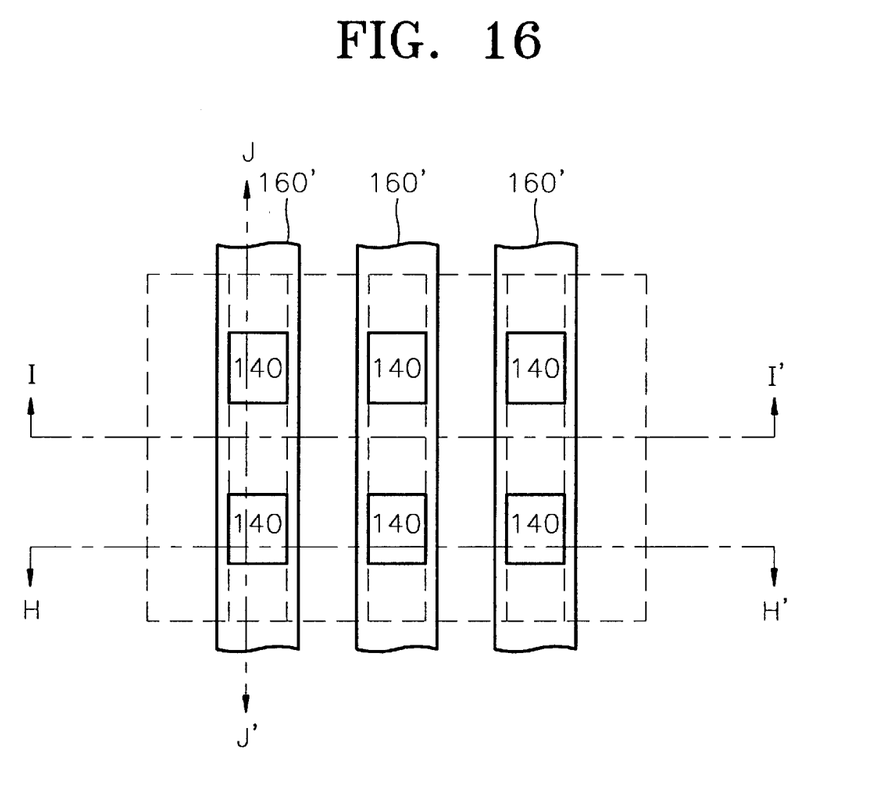
Figure 17:
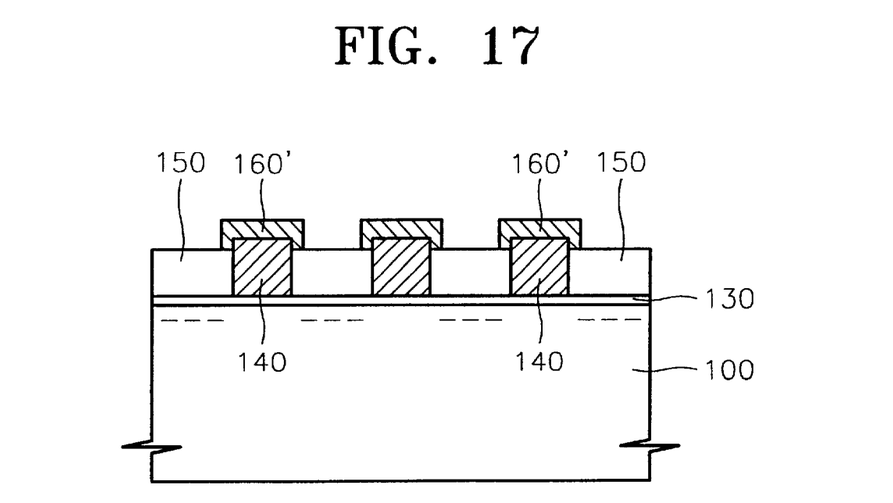
Figure 18:
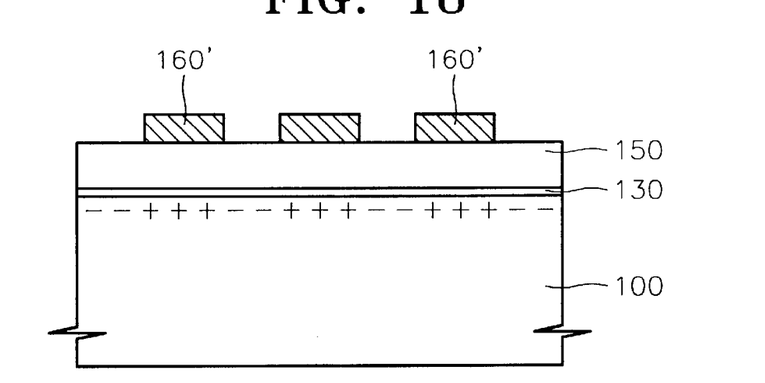
Figure 19:
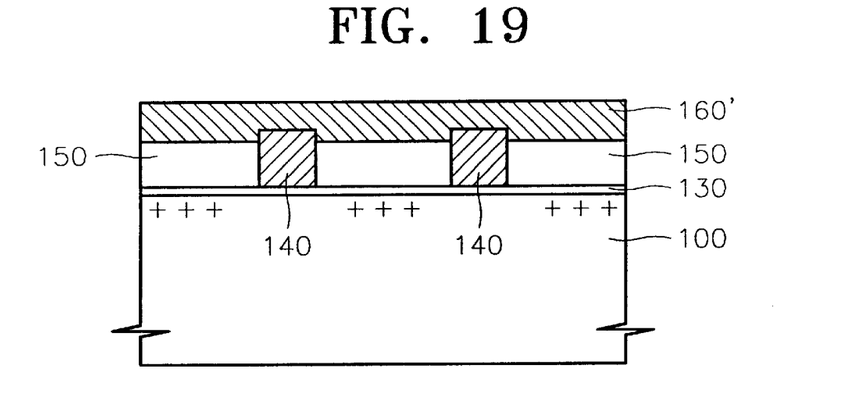

As shown in FIG. 16, second polysilicon layer lines 160' is longitudinally formed in the bit line direction on the first polysilicon layer patterns 140 and the buried oxide layers 150. The second polysilicon layer lines 160' completely cover the first polysilicon layer patterns 140. The second polysilicon layer lines 160' are formed of polysilicon like the first polysilicon layer lines 140'. The method of forming the second polysilicon layer lines 160' is the same as the method of forming the first polysilicon layer lines 140'. FIGS. 17 through 19 are sectional views taken along the lines H–H', I–I', and J–J', respectively, of FIG. 16, which describes the structure, in which the second polysilicon layer lines 160' are formed well. As shown in FIGS. 17 through 19, the second polysilicon layer lines 160' are formed to cover the upper side surfaces of the first polysilicon layer patterns 140 as well as the upper surfaces of the first polysilicon layer patterns 140. Namely, the second polysilicon layer lines 160' cover the upper side walls of the first polysilicon layer patterns 140 corresponding to the difference between the thickness of the first polysilicon layer pattern 140 and the buried oxide layer 150 and the second polysilicon layer lines 160' are extended to some upper portions of the buried oxide layers 150. After forming the second polysilicon layer lines 160', phosphorus as an impurity is implanted into the second polysilicon layer lines 160' by depositing $POCl_3$ on the second polysilicon layer lines 160'. The implanted phosphorus makes the first polysilicon layer patterns 140 and the second polysilicon layer lines 160' doped with impurities.

Figure 20:
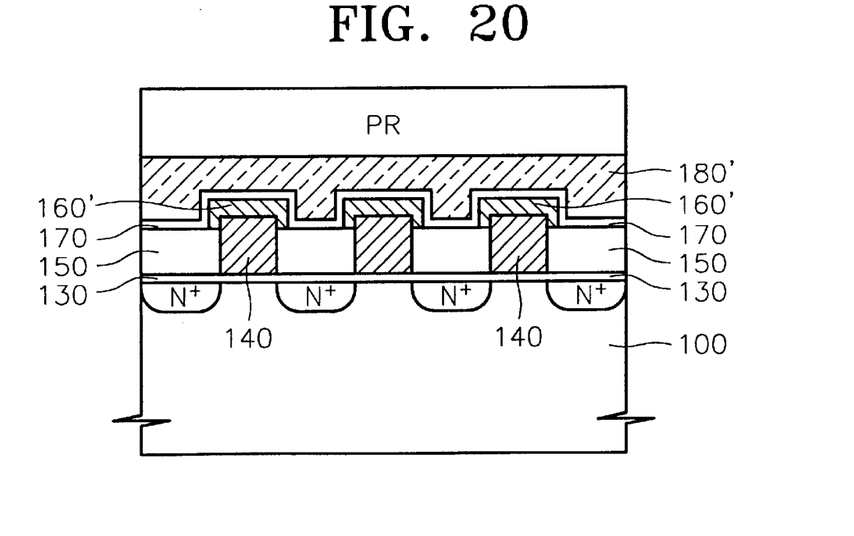
Figure 21:
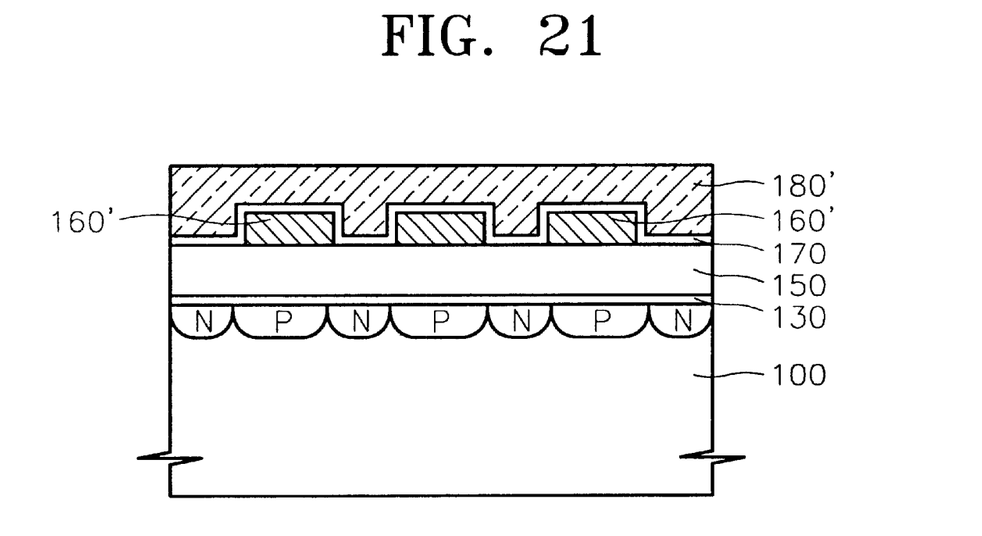
Figure 22:
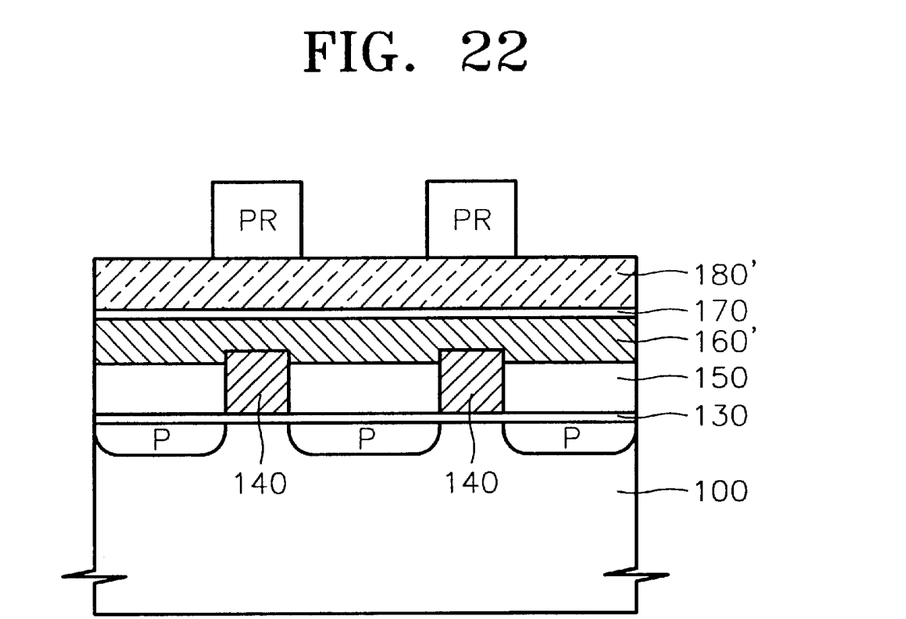

As shown in FIGS. 20 through 22 taken along the same direction and surface as those of FIGS. 17 through 19, an interlayer dielectric layer 170 and a third polysilicon layer 180' are sequentially formed on the exposed surfaces of the buried oxide layers 150 and the second polysilicon layer lines 160'. The interlayer dielectric layer 170 is formed to have the ONO structure using the thermal oxidation method and the CVD method. The thickness of the interlayer dielectric layer 170 is within about 500 Å. When the thickness of the interlayer dielectric layer 170 is large, it is not preferable since the coupling ratio of the floating gate is reduced. In order to increase the conductivity of the control gate electrode, it is possible to form tungsten silicide (not shown) on the third polysilicon layers 180'. The photoresist layer pattern (PR) is formed on the third polysilicon layer 180'. The photoresist layer pattern (PR) is longitudinally arranged in the word line direction.

Figure 23:
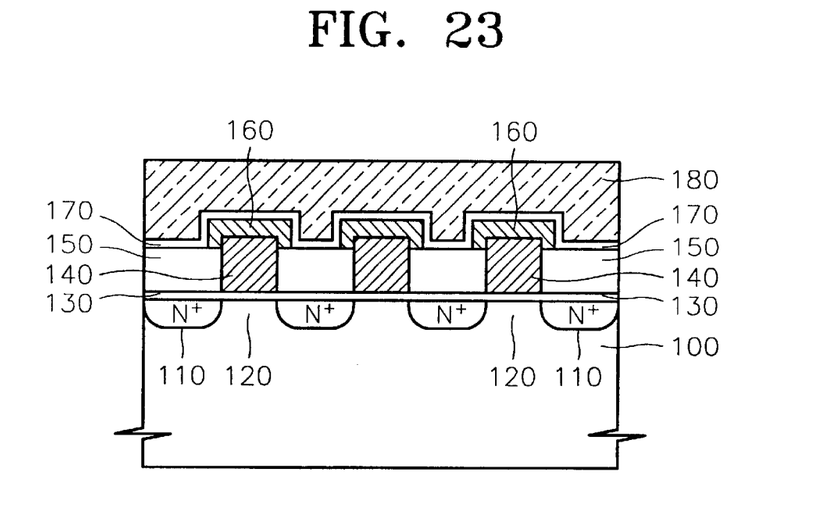
Figure 24:
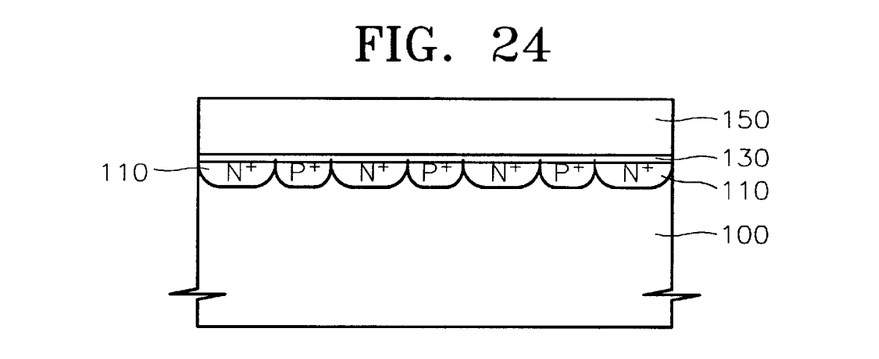
Figure 25:
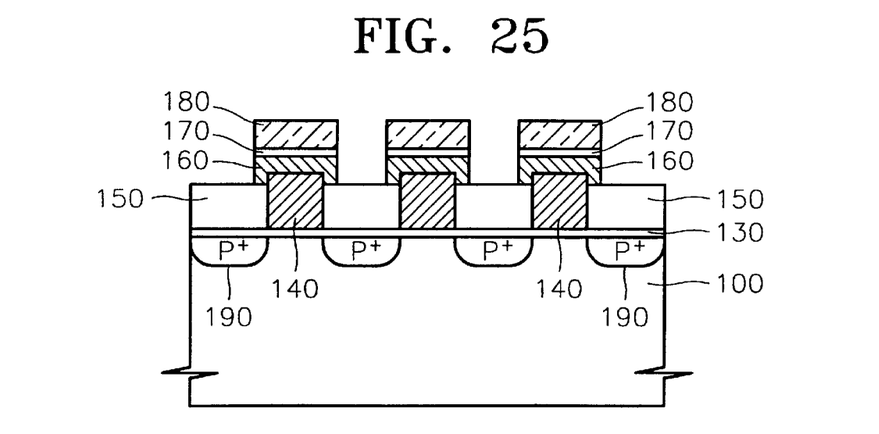

As shown in FIGS. 23 through 25 taken along the same direction and surface as those of FIGS. 17 and 19, the third polysilicon layer 180', the interlayer dielectric layer 170, and the second polysilicon layer lines 160' are sequentially etched using the photoresist layer pattern (PR of FIGS. 20 through 22) as an etching mask. When the etching process is performed, second polysilicon stringer can be removed by over etching the buried oxide layers 150. Since it is not necessary to etch the relatively thick first polysilicon layer patterns 140, the probability that the second polysilicon stringer is generated is reduced. When the etching process is performed, the second polysilicon layer patterns 160 that form part of the floating gate electrode together with the first polysilicon layer patterns 140, the patterned interlayer dielectric layers 170, and the third polysilicon layer patterns 180 that form the control gate are formed. The upper surface area of the formed second polysilicon layer pattern 160 is wider than that of the first polysilicon layer pattern 140. Therefore, the floating gate electrode having a bilayered structure of the first and second polysilicon layer patterns 140 and 160 can have an area wider than the floating gate having a single-layered structure of the first polysilicon layer pattern. Therefore, an area in which the surface of the floating gate electrode contacts the interlayer dielectric layer 170 increases. Accordingly, the coupling ratio of the floating gate electrode increases.

The layout of the non-volatile memory cell completed by the above process is shown in FIG. 6.

As mentioned above, in the non-volatile memory cell according to the present invention and the manufacturing method thereof, it is possible to increase the coupling ratio of the floating gate by increasing the area in which the floating gate contacts the interlayer dielectric layer and the control gate by forming the floating gate to have the bilayered structure. It is possible to improve the degree of integration of a device since isolation is performed by the buried oxide layers without using the field oxide layers for isolation. Since the thick buried oxide layer exists between the interlayer dielectric layer and the semiconductor substrate, although a high voltage is applied to the control gate, the tunnel oxide layer can have high enough tolerance to the applied high voltage.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method for forming a non-volatile memory cell, comprising the steps of:

(a) forming a tunnel oxide layer on a first conductivity type semiconductor substrate;

(b) forming first polysilicon layer lines longitudinally arranged in a bit line direction and separated from each other by a predetermined distance on the tunnel oxide layer;

(c) forming source and drain regions by implanting second conductivity type impurity ions in the semiconductor substrate restricted by the first polysilicon layer lines;

(d) forming first polysilicon layer patterns in the form of islands by patterning the first polysilicon layer lines;

(e) forming buried oxide layers for filling spaces between the first polysilicon layer patterns, wherein forming the buried oxide layers comprises forming an oxide layer on the first polysilicon layer patterns and the exposed tunnel oxide layer and flattening the oxide layer using an etch back process so that the upper side surfaces of the first polysilicon layer patterns are exposed;

(f) forming second polysilicon layer lines longitudinally arranged in the bit line direction to be separated from each other on the buried oxide layers and the first polysilicon layer patterns so that the second polysilicon layer lines completely cover the first polysilicon layer patterns, wherein the first and second polysilicon layer lines are used in forming a bilayered floating gate structure;

(g) forming an interlayer dielectric layer on the exposed surfaces of the second polysilicon layer lines and the buried oxide layers;

(h) forming third polysilicon layer patterns longitudinally arranged in a word line direction on the interlayer dielectric layer so that the third polysilicon layer patterns completely overlap the first polysilicon layer patterns and partially overlap the second polysilicon layer lines such that portions of the second polysilicon layer lines are exposed and not covered by the third polysilicon layer patterns; and (i) after forming the third polysilicon layer patterns, sequentially removing the interlayer dielectric layer and the portions of the second polysilicon layer lines exposed by the third polysilicon layer patterns.

2. The method of claim 1, wherein the first polysilicon layer lines are formed to have a thickness greater than 1000 Å.

3. The method of claim 1, wherein the second conductivity type impurity ions are arsenic (As) ions.

4. The method of claim 1, wherein the buried oxide layers are formed by a chemical vapor deposition (CVD) method.

5. The method of claim 1, wherein the thickness of the buried oxide layer is smaller than the thickness of the first polysilicon layer patterns by 20 Å.

6. The method of claim 1, wherein the interlayer dielectric layer is formed to have an oxide/nitride/oxide (ONO) structure.

* * * * *